(12) United States Patent
Zeng et al.

(10) Patent No.: US 10,169,264 B1
(45) Date of Patent: Jan. 1, 2019

(54) IMPLEMENTING ROBUST READBACK CAPTURE IN A PROGRAMMABLE INTEGRATED CIRCUIT

(71) Applicant: Xilinx, Inc., San Jose, CA (US)

(72) Inventors: Michelle E. Zeng, San Jose, CA (US); Subodh Kumar, San Jose, CA (US); Uma Durairajan, Sunnyvale, CA (US); Weiguang Lu, San Jose, CA (US); Karthy Rajasekharan, Cupertino, CA (US); Kumar Rahul, Hyderabad (IN)

(73) Assignee: XILINX, INC., San Jose, CA (US)

( * ) Notice: Subject to any disclaimer, the term of this patent is extended or adjusted under 35 U.S.C. 154(b) by 19 days.

(21) Appl. No.: 15/639,752

(22) Filed: Jun. 30, 2017

(51) Int. Cl.
*G06F 13/16* (2006.01)
*H03K 19/177* (2006.01)
(Continued)

(52) U.S. Cl.
CPC . *G06F 13/1689* (2013.01); *G01R 31/318516* (2013.01); *G06F 3/0604* (2013.01);
(Continued)

(58) Field of Classification Search
None
See application file for complete search history.

(56) References Cited

U.S. PATENT DOCUMENTS 5,426,379 A * 6/1995 Trimberger ............... G06F 5/10
326/38
5,717,695 A * 2/1998 Manela .......... G01R 31/318321
326/39
(Continued)

FOREIGN PATENT DOCUMENTS

CN  102436840 A  *  5/2012
CN  103631738 A  *  3/2014
CN  105335105 A  *  2/2016

OTHER PUBLICATIONS

'Reconfiguration time overhead on field programmable gate arrays: reduction and cost model' by F. Duhem et al., IET Comput. Digit. Tech., 2012, vol. 6, Iss. 2, pp. 105-113. (Year: 2012).*

(Continued)

*Primary Examiner* — Steven G Snyder
(74) *Attorney, Agent, or Firm* — Robert M. Brush

(57) ABSTRACT

In an example, a memory circuit in a programmable integrated circuit (IC) includes: a control port and a clock port; a configurable random access memory (RAM) having a control input and a clock input; input multiplexer logic coupled to the control input and the clock input; and a state machine coupled to the input multiplexer logic and configuration logic of the programmable IC, the state machine configured to: in response to being enabled by the configuration logic, control the input multiplexer logic to switch a connection of the control input from the control port to the state machine and, subsequently, switch a connection of the clock input from the clock port to a configuration clock source; and in response to being disabled by the configuration logic, control the input multiplexer logic to switch the connection of the clock input from the configuration clock source to the clock port and, subsequently, switch the connection of the control input from the state machine to the control port.

20 Claims, 11 Drawing Sheets

(51) Int. Cl.
*G06F 3/06* (2006.01)
*G06F 13/40* (2006.01)
*G11C 7/10* (2006.01)
*G01R 31/3185* (2006.01)

(52) U.S. Cl.
CPC .......... *G06F 3/0635* (2013.01); *G06F 3/0673* (2013.01); *G06F 13/4022* (2013.01); *G06F 13/4068* (2013.01); *G11C 7/106* (2013.01); *G11C 7/1012* (2013.01); *H03K 19/1776* (2013.01); *H03K 19/17776* (2013.01)

(56) References Cited

U.S. PATENT DOCUMENTS

| | | | |
|---|---|---|---|
| 6,069,489 A | 5/2000 | Iwanczuk et al. | |
| 6,097,210 A | 8/2000 | Iwanczuk et al. | |
| 6,137,307 A | 10/2000 | Iwanczuk et al. | |
| 6,154,048 A | 11/2000 | Iwanczuk et al. | |
| 6,191,614 B1* | 2/2001 | Schultz | H03M 13/09 326/38 |
| 6,201,406 B1 | 3/2001 | Iwanczuk et al. | |
| 6,204,687 B1* | 3/2001 | Schultz | G06F 17/5054 326/38 |
| 6,255,848 B1* | 7/2001 | Schultz | H03K 19/1776 326/38 |
| 6,262,596 B1* | 7/2001 | Schultz | H03M 13/09 326/38 |
| 6,425,077 B1 | 7/2002 | Le et al. | |
| 6,429,682 B1* | 8/2002 | Schultz | H03M 13/09 326/38 |
| 6,453,456 B1* | 9/2002 | Price | G06F 17/5027 716/117 |
| 6,651,238 B1 | 11/2003 | Wells et al. | |
| 6,665,766 B1 | 12/2003 | Guccione et al. | |
| 6,836,842 B1 | 12/2004 | Guccione et al. | |
| 7,271,616 B2* | 9/2007 | Goel | H03K 19/17736 326/37 |
| 7,576,558 B1 | 8/2009 | Lysaght et al. | |
| 7,689,726 B1 | 3/2010 | Sundararajan et al. | |
| 8,103,992 B1* | 1/2012 | Chan | G06F 17/5054 716/100 |
| 9,626,264 B2* | 4/2017 | Yeom | G06F 11/26 |
| 2006/0022700 A1* | 2/2006 | Goel | H03K 19/17736 326/8 |
| 2015/0340103 A1* | 11/2015 | Chakraborty | G11C 29/38 714/719 |
| 2016/0092328 A1* | 3/2016 | Yeom | G06F 11/26 714/33 |
| 2017/0293518 A1* | 10/2017 | McLaury | G06F 11/079 |

OTHER PUBLICATIONS

'Bitstream Relocation with Local Clock Domains for Partially Reconfigurable FPGAs' by Adam Flynn et al., copyright EDAA, 2009. (Year: 2009).*

* cited by examiner

US 10,169,264 B1

IMPLEMENTING ROBUST READBACK CAPTURE IN A PROGRAMMABLE INTEGRATED CIRCUIT

TECHNICAL FIELD

Examples of the present disclosure generally relate to electronic circuits and, in particular, to implementing robust readback capture in a programmable integrated circuit (IC).

BACKGROUND

An increasingly popular application of a field programmable gate array (FPGA) is the debug and functional verification of an application specific integrated circuit (ASIC) design through hardware emulation. In an emulation application, the user can perform a series of operations, such as a series of random access memory (RAM) operations, and then stop the dock to dump out register and memory contents for debug and analysis. Such an operation is referred to as readback capture. With respect to a RAM in the FPGA, readback capture is the process of cycling through addresses of the RAM and reading out the data, which eventually propagates to the bitstream. A user can analyze the output bitstream to interpret and reveal the contents of the RAM at each address.

Readback capture of a RAM in a programmable IC, such as an FPGA, can be affected by dock glitches, as well as loss of user data. To avoid these problems, non-ideal constraints are imposed on the user and the user design being emulated. It is desirable to perform readback capture of a RAM in a programmable IC that avoids both clock glitches and loss of user data.

SUMMARY

Techniques for implementing robust readback capture in a programmable integrated circuit (IC) are described. In an example, a memory circuit in a programmable IC includes: a control port and a clock port; a configurable random access memory (RAM) having a control input and a clock input; input multiplexer logic coupled to the control input and the clock input; and a state machine coupled to the input multiplexer logic and configuration logic of the programmable IC, the state machine configured to: in response to being enabled by the configuration logic, control the input multiplexer logic to switch a connection of the control input from the control port to the state machine and, subsequently, switch a connection of the clock input from the clock port to a configuration clock source; and in response to being disabled by the configuration logic, control the input multiplexer logic to switch the connection of the clock input from the configuration clock source to the clock port and, subsequently, switch the connection of the control input from the state machine to the control port.

In another example, a programmable integrated circuit (IC) includes: configuration logic that controls a configuration memory; first and second clock sources; and a programmable fabric having a memory circuit. The memory circuit includes: a configurable random access memory (RAM) having a control input and a clock input; input multiplexer logic coupled to the control input and the clock input; and a state machine coupled to the input multiplexer logic and the configuration logic, the state machine configured to: in response to being enabled by the configuration logic, control the input multiplexer logic to switch a connection of the control input from the programmable fabric to the state machine and, subsequently, switch a connection of the clock input from the first clock source to the second clock source; and in response to being disabled by the configuration logic, control the input multiplexer logic to switch the connection of the clock input from the second clock source to the first clock source and, subsequently, switch the connection of the control input from the state machine to the programmable fabric.

In another example, a method of readback capture of a memory circuit in a programmable integrated circuit (IC) includes: suspending a user clock coupled to the memory circuit; enabling a state machine coupled between configuration logic of the programmable IC and the memory circuit; transferring connection of a control input of the memory circuit from a user circuit configured in the programmable IC to the state machine; transferring connection of a clock input of the memory circuit from the user clock to a configuration clock of the configuration logic; and performing a readback operation that includes sequences of enabling and disabling the memory circuit for reading.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
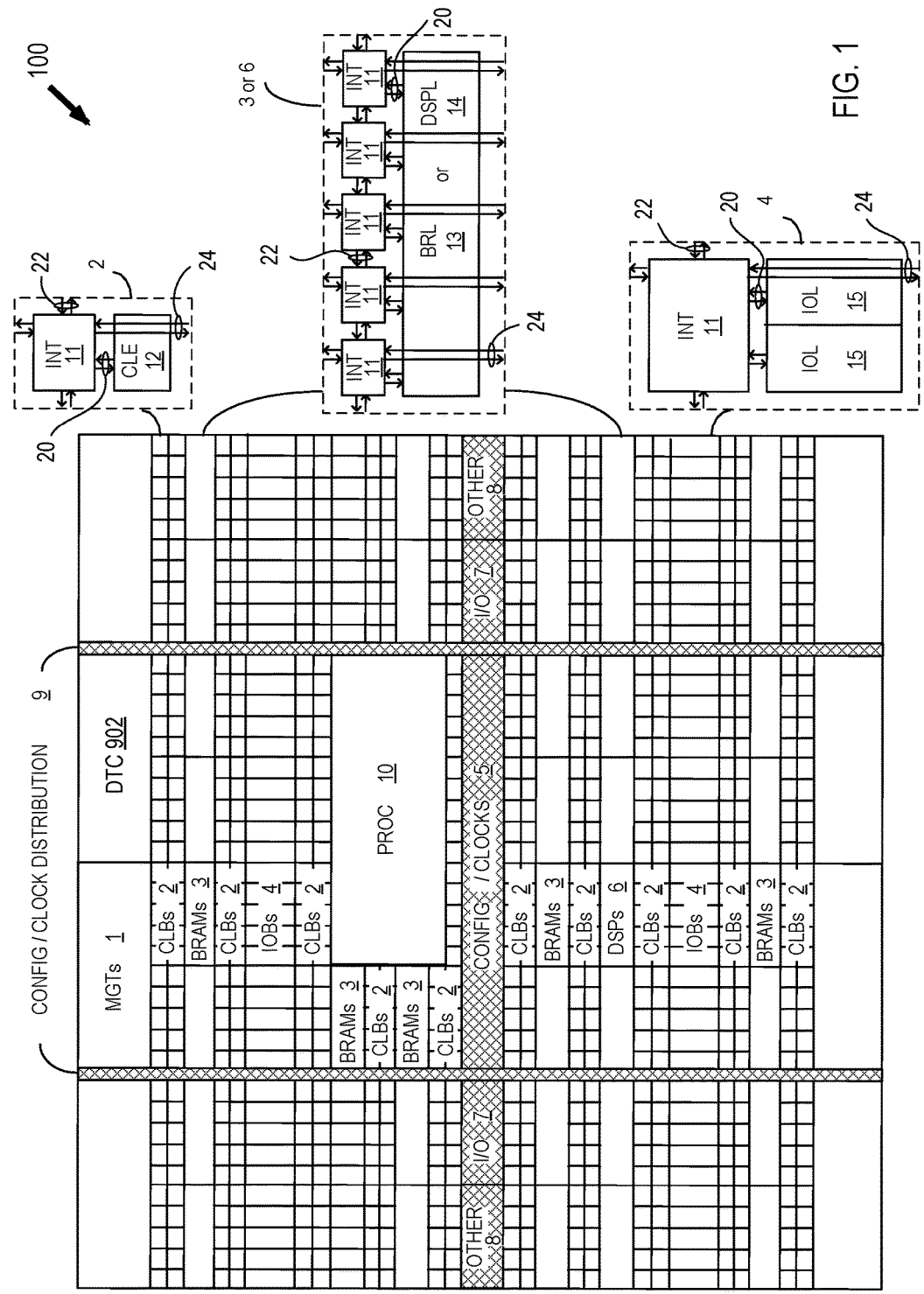
FIG. 1 illustrates a field programmable gate array (FGPA) in which techniques described herein can be employed.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 illustrates an architecture of a field programmable gate array (FPGA) 100 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. The BRAMs 3 include readback capture logic, as described further below.

In some FPGAs, each programmable tile can include at least one programmable interconnect element ("INT") 11 having connections to input and output terminals 20 of a programmable logic element within the same tile, as shown by examples included at the top of FIG. 1. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 1) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
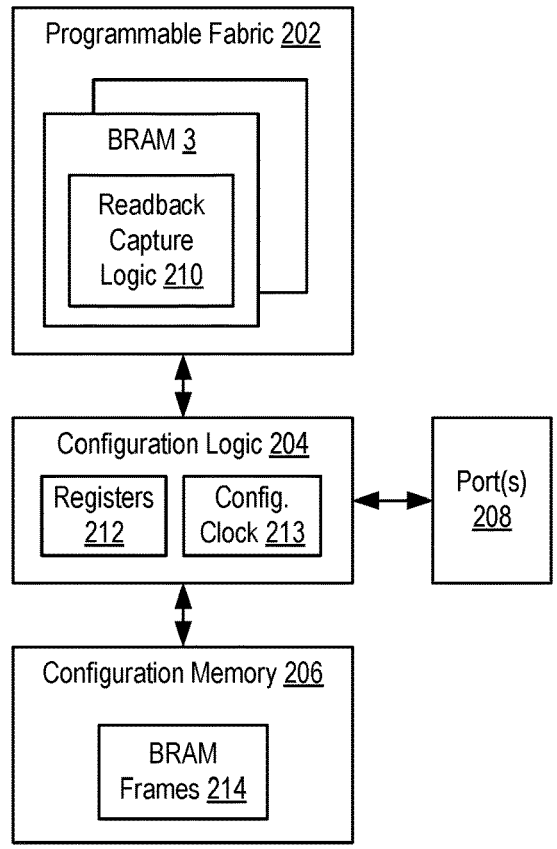
FIG. 2 is a block diagram depicting a portion of the FPGA of FIG. 1 according to an example.

FIG. 2 is a block diagram depicting a portion of the FPGA 100 according to an example. The FPGA 100 includes a programmable fabric 202, which includes the BRAMs 3 (as well as other blocks, such as CLEs 2, IOBs 4, DSPs 6, and the like). Each BRAM 3 includes readback capture logic 210 configured to perform readback operations as described further herein. The FPGA 100 includes configuration logic 204, which can include various registers 212. A user can read and write to the registers 212 and send and receive control signals to the configuration logic 204 to operate the FPGA 100 (e.g., load a bitstream into the FPGA 100 to implement a circuit, perform a readback capture operation, etc.). The configuration logic 204 includes a configuration clock 213. The configuration logic 204 is accessible through one or more ports 208, which can include ports dedicated to the configuration logic 204 and/or multi-purpose ports (e.g., a Joint Test Action Group (JTAG) port or the like). The configuration logic 204 writes to and reads from a configuration memory 206. The configuration memory 206 can be a static random access memory (SRAM) or the like. A bitstream stored in the configuration memory 206 is logically divided into frames, some of which are associated with the BRAMs 3 ("BRAM frames 214"). During a readback capture operation, the readback capture logic 210 cooperates with the configuration logic 204 to store the current contents of BRAMs 3 in the BRAM frames 214 of the configuration memory 206. The configuration logic 204 outputs the contents of the configuration memory 206 as a readback stream through the port(s) 208.

Figure 3:
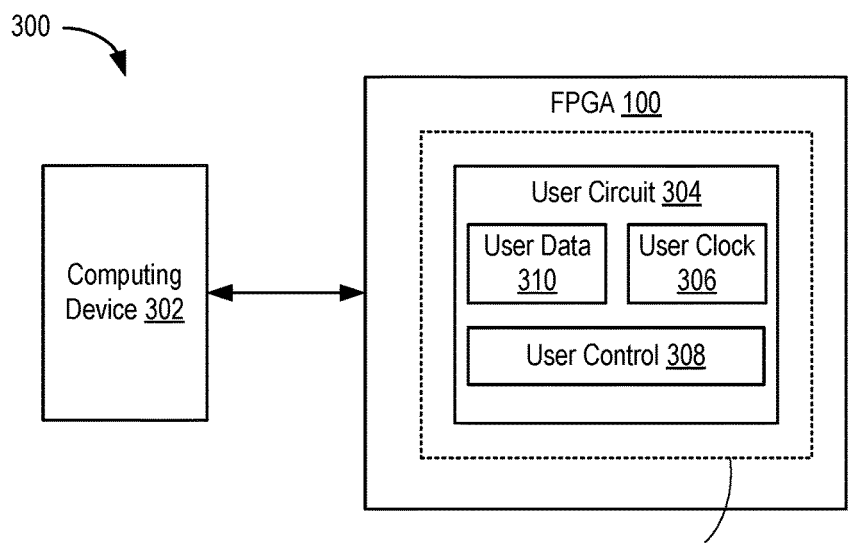
FIG. 3 is a block diagram depicting an emulation system according to an example.

FIG. 3 is a block diagram depicting an emulation system 300 according to an example. The emulation system 300 includes a computing device 302 coupled to the FPGA 100. The computing device 302 loads a bitstream to the FPGA 100 to implement a user circuit 304 in the programmable logic 202. The user circuit 304 can emulate the design of an application specific integrated circuit (ASIC) or the like. The user circuit 304 is implemented using one or more BRAMs 3. The user circuit 304 includes user data 310 input to the BRAMs 3, user control 308 for controlling the BRAMs 3, and user clock 306 for clocking the BRAMs 3. For purposes of debugging, a user can initiate readback capture operations. The computing device 302 commands the FPGA 100 to perform the readback capture operations. The FPGA 100 outputs a readback capture stream for analysis by the computing device 302. The readback capture stream includes frames that include the contents of the BRAMs 3.

The readback capture logic 210 of a BRAM 3 and its operation is described below. First, preventing corruption of a BRAM due to clock glitches during a readback operation is described. Second, preventing loss of previous state of a BRAM during a readback operation is described.

Preventing Corruption Due to Clock Glitches During Readback Capture

Figure 4:
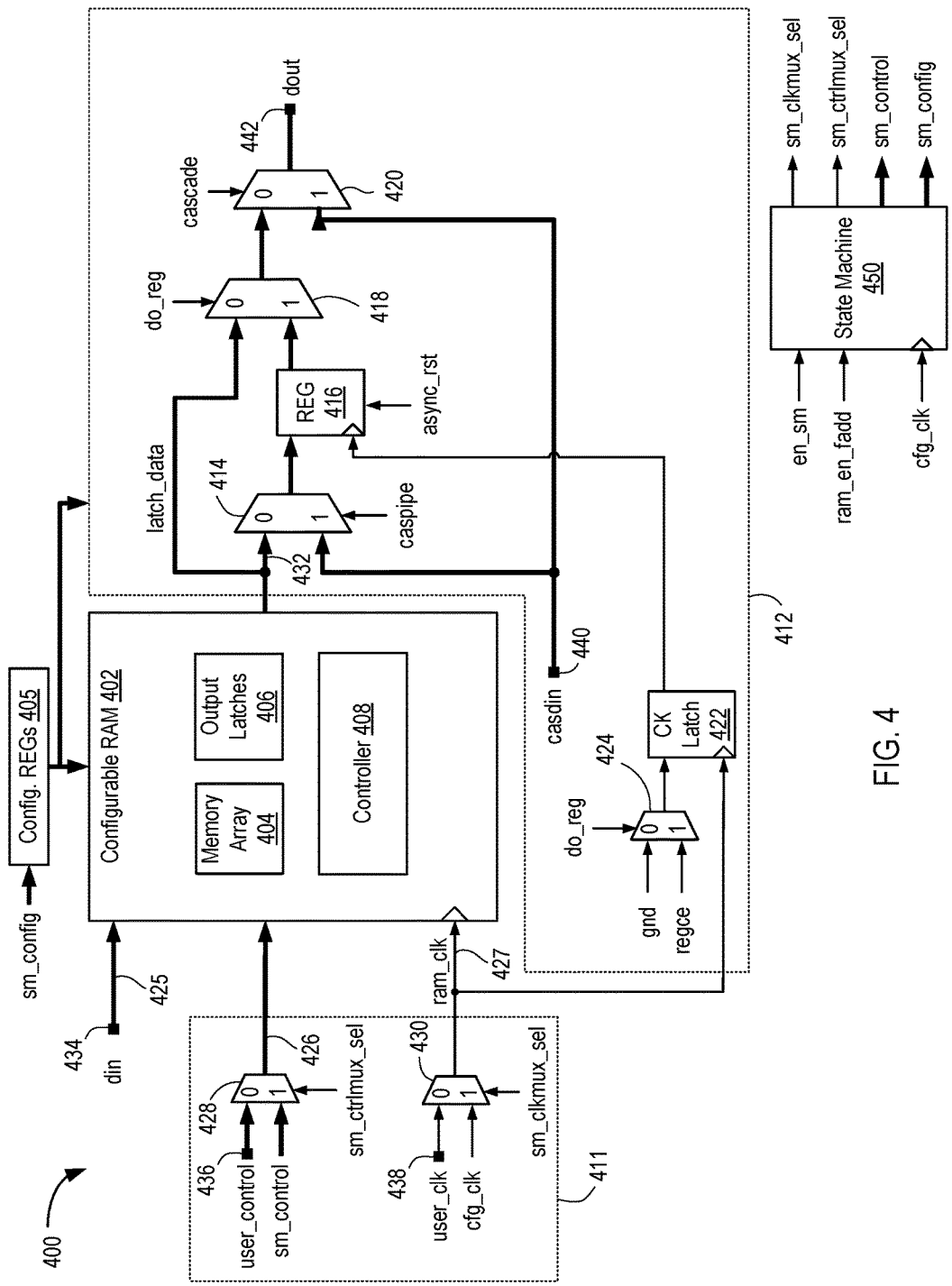
FIG. 4 is a block diagram of a memory circuit in a programmable IC according to an example.

FIG. 4 is a block diagram of a BRAM 3 according to an example. In general, the BRAM 3 is a memory circuit that can be used in FPGAs and other types of programmable ICs. The BRAM 3 includes a configurable random access memory (RAM) 402, output logic 412, input multiplexer logic 411, and a state machine (SM) 450. The input multiplexer logic 411 and the SM 450 comprise the readback capture logic 210. The BRAM 3 also includes a data-in port 434, a control port 436, a clock port 438, a cascade-in port 440, and a data-out port 442. The ports 434 . . . 442 are coupled to other circuitry in the programmable fabric 202. The BRAM 3 further includes configuration registers 405 that store various attributes of the BRAM 3 that can be set during configuration of the FPGA 100 (e.g., port widths, pipeline settings, and the like).

The configurable RAM 402 includes a memory array 404, output latches 406, and controller 408. The memory array 404 comprises an array of memory cells, such as SRAM cells, as well as associated multiplexer logic. The controller 408 provides address, write strobe, read strobe, and the like signals to memory array 404. The output latches 406 capture output of the memory array 404 in response to a read operation. The output logic 412 includes a multiplexer 414, a register ("REG 416"), a multiplexer 418, a multiplexer 420, a clock (CK) latch 422, and a multiplexer 424. The output logic 412 is coupled between the latched output of the configurable RAM 402 (i.e., output of the output latches 406) and the data-out port 442.

The configurable RAM 402 includes a data input 425, a control input 426, and a clock input 427. In the drawing, thicker signal lines indicate busses comprising a plurality of signal lines. The data input 425 is coupled to the data-in port 434. The data-in port 434 supplies a signal din to the data input 425 of the configurable RAM 402. The signal din comprises a plurality of logic signals that convey a multi-bit data input value. The signal din is generated by the user circuit 304 configured in the FPGA 100 (e.g., user data 310).

Each of the control input 426 and the clock input 427 is multiplexed by input multiplexer logic 411. In particular, the control input 426 of the configurable RAM 402 is coupled to an output of the multiplexer 428, and the clock input 427 of the configurable RAM 402 is coupled to an output of the multiplexer 430. Each of the multiplexers 428, 430 is a two-input multiplexer that selects either the first input (denoted by a "0") or the second input (denoted by a "1").

The first input of the multiplexer 428 is coupled to the control port 436. The control port 436 supplies a user-generated control signal ("user_control"). The user_control signal is generated by the user circuit 304 (e.g., user control 308). The second input of the multiplexer 428 is coupled to the SM 450 to receive an SM-generated control signal ("sm_control"). Each of the user_control and sm_control signals comprises a plurality of logic signals, including an address signal ("addr"), an enable signal ("en"), a write enable signal ("we"), cascade signals (e.g., caspipe and cascade signals), and a clock enable signal ("regce"). For clarity, the signals addr, en, and we are not explicitly shown as individual signals in FIG. 4. In general, the addr signal supplies an address to the memory array 404 and the en and we signals enable operations/write operations. The signals caspipe, cascade, and regce are discussed further below. A control input of the multiplexer 428 is coupled to the SM 450 to receive a signal sm_ctrlmux_sel. When the SM 450 asserts the sm_ctrlmux_sel signal, the multiplexer 428 selects the sm_control signal. When the SM 450 de-asserts the sm_ctrlmux_sel signal, the multiplexer 428 selects the user_control signal.

A first input of the multiplexer 430 is coupled to the clock port 438. The clock port 438 supplies a user-generated clock signal ("user_clk") in a user clock domain. The user_clk signal is in the clock domain of the user circuit 304 (e.g., user clock 306). The second input of the multiplexer 430 is coupled to the configuration logic 204 to receive the configuration clock ("cfg_clk") in the configuration clock domain. The SM 450 operates based on the cfg_clk signal and thus cfg_clk is also described as being in the SM clock domain. A control input of the multiplexer 430 is coupled to the SM 450 to receive a signal sm_clkmux_sel. When the SM 450 asserts the sm_clkmux_sel signal, the multiplexer 430 selects the cfg_clk signal. When the SM 450 de-asserts the sm_clkmux_sel signal, the multiplexer 430 selects the user_clk signal. The output of the multiplexer 430 supplies a signal ram_clk to the clock input 427 of the configurable RAM 402.

A latched output 432 of the configurable RAM 402 (supplied by the output latches 406) is coupled to output logic 412. The latched output 432 supplies a signal latch_data, which comprises a plurality of logic signals that convey a multi-bit data output value. The multiplexers 414, 418, 420, and 424 are each a two-input multiplexer that selects either the first input (denoted by a "0") or the second input (denoted by a "1"). A first input of the multiplexer 414 is coupled to the latched output 432 of the configurable RAM 402. A second input of the multiplexer 414 is coupled to the cascade-in port 440 to receive a signal casdin, which is a cascaded data input signal that can be generated by another BRAM 3 (i.e., the data output of another BRAM 3). An output of the multiplexer 414 is coupled to an input of the REG 416. A control input of the multiplexer 414 is coupled to the control input 426 to receive the signal caspipe, discussed further below.

The REG 416 has a width that supports the width of the latched output 432. A clock input of the REG 416 is coupled to an output of the CK latch 422. An output of the REG 416 is coupled to a second input of the multiplexer 418. A first input of the multiplexer 418 is coupled to the latched output 432 of the configurable RAM 402. A control input of the multiplexer 418 receives a signal do_reg, discussed further below. An output of the multiplexer 418 is coupled to a first input of the multiplexer 420. A second input of the multiplexer 420 receives the signal casdin. A control input of the multiplexer 420 is coupled to the control input 426 to receive the signal cascade, discussed further below. An output of the multiplexer 420 is coupled to the data-out port 442, which provides a signal dout of the BRAM 3.

A first input of the multiplexer 424 receives a ground signal (i.e., a logic "0"). A second input of the multiplexer 424 is coupled to the control input 426 to receive the signal regce, discussed further below. A control input of the multiplexer 424 receives the signal do_reg. An output of the multiplexer 424 is coupled to an input of the CK latch 422. A clock input of the CK latch 422 is coupled to the output of the multiplexer 430.

The signal do_reg controls whether the REG 416 is added to the output pipeline of the BRAM 3. The signal do_reg can be generated by a configuration register 405, which can be set by the SM 450 either during configuration or during readback capture. If the signal do_reg is asserted, the multiplexer 418 selects the output of the REG 416. If the signal do_reg is de-asserted, the multiplexer 418 selects the latched output 432 of the configurable RAM 402. The signal caspipe controls whether the cascaded data input signal (casdin) is coupled to the REG 416. If the signal caspipe is asserted, the signal casdin is coupled to the input of the REG 416. If the signal caspipe is de-asserted, the signal latch_data is coupled to the REG 416. The signal cascade controls whether the output signal dout is the output of the multiplexer 418 or the cascaded data input (casdin). If the signal cascade is asserted, the multiplexer 420 selects the signal casdin as the output signal dout. If the signal cascade is de-asserted, the multiplexer 420 selects the output of the multiplexer 418 as the output signal dout (e.g., either the latched_data signal or the output of the REG 416).

The output of the CK latch 422 clocks the REG 416. When the input of the CK latch 422 is logic low, the output of the CK latch 422 is logic low. When the input of the CK latch 422 is logic high, the output of the CK latch 422 is the clock signal at the clock input. For example, the CK latch 422 can be implemented as an active-low latch followed by an AND gate. The CK latch 422 latches the output of the multiplexer 424 based on the signal ram_clk output by the multiplexer 430. If the signal do_reg is asserted, the multiplexer 424 outputs the signal regce, which is received from the control input 426. If the signal do_reg is de-asserted, the multiplexer 424 outputs the ground signal (e.g., logic "0"). The signal regce can be asserted or de-asserted in order to clock the latched_data signal into the REG 416 if the REG 416 is enabled in the output pipeline (e.g., by asserting do_reg).

The SM 450 includes inputs coupled to the configuration logic 204 that receive an enable signal (en_sm) and a frame enable signal (ram_en_fadd). A clock input of the SM 450 receives the cfg_clk signal. The SM 450 outputs the sm_clkmux_sel signal that controls the multiplexer 430 and the sm_ctrlmux_sel signal that controls the multiplexers 428. The SM 450 also outputs the sm_control signal that drives the second input of the multiplexer 428 and a signal sm_config. The signal sm_config is coupled to the configuration registers 405 and is used to configure the mode of the BRAM 3. In particular, the signal sm_config can set various attributes of the BRAM 3, such as input/output width, pipeline settings, etc.

The SM 450 begins a readback capture operation in response to assertion of the en_sm signal by the configuration logic 204. The SM 450 performs various operations in response to assertion of the en_sm signal, as discussed further below. The SM 450 commands read operations to the configurable RAM 402 in response to assertion of the ram_en_fadd signal, as discussed further below.

In the example of FIG. 4, the BRAM 3 is shown as including a single-port memory. In other examples, the BRAM 3 can be configurable as a multi-port memory (e.g., a dual port memory). In such case, the data, control, and clock inputs are duplicated for each additional port supported by the BRAM 3. Likewise, the latched output 432 and the associated output logic 412 is duplicated for each additional port supported by the BRAM 3. The readback capture techniques described herein are also applicable to such multi-port BRAMs.

Figure 5:
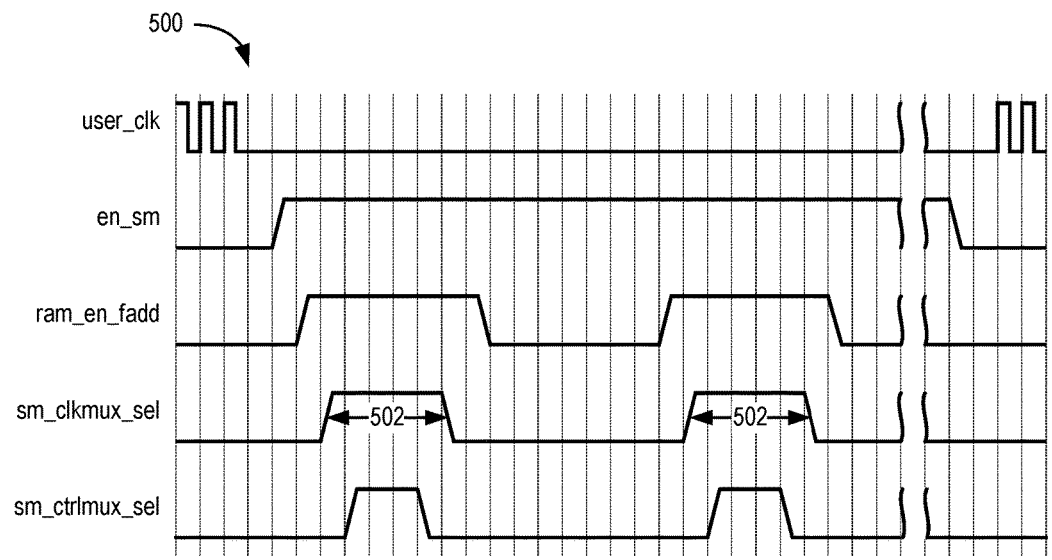
FIG. 5 is a signal diagram depicting signals of the memory circuit of FIG. 4 according to an example.

FIG. 5 is a signal diagram 500 depicting signals of the BRAM 103 according to an example. In the present example, the diagram 500 shows states of the user_clk, en_sm, ram_en_fadd, sm_clkmux_sel, and sm_ctrlmux_sel signals during a readback capture operation. During readback capture, the user_clk signal is suspended (e.g., the user clock does not toggle). The configuration logic 204 asserts the signal en_sm to enable the SM 450 and initiate the readback capture operation in the BRAM 3. The configuration logic 204 asserts and de-asserts the signal ram_en_fadd one or more times to perform readback for one or more frames. During each frame of readback, the SM 450 generates addresses to cycle through a portion of the address space of the BRAM 3 to read the data stored therein. The configuration logic 204 stores the data read from the BRAM 3 in the configuration memory 206. When the configuration logic 204 de-asserts the signal ram_en_fadd, the SM 450 does not perform any read operations.

In the present example, during each readback frame, the SM 450 performs a sequence of asserting the sm_clkmux_sel signal to select the configuration clock and then asserting the sm_ctrlmux_sel signal to select the SM-generated control signal (sm_control). The configurable RAM 402 receives the cfg_clk signal during the time periods 502. After one or more read operations, the SM 450 performs a sequence of de-asserting the sm_ctrlmux_sel signal to select the user-generated control signal and then de-asserting the signal sm_clkmux_sel to select the user-generated clock signal (user_clk). The SM 450 can perform these sequences of operations for each readback frame (e.g., each pulse of the ram_en_fadd signal). As discussed below with respect to FIG. 6, this sequence of operations can result in a clock glitch during the time period 502 when switching clock domains while the signal sm_ctrlmux_sel is not asserted.

Figure 6:
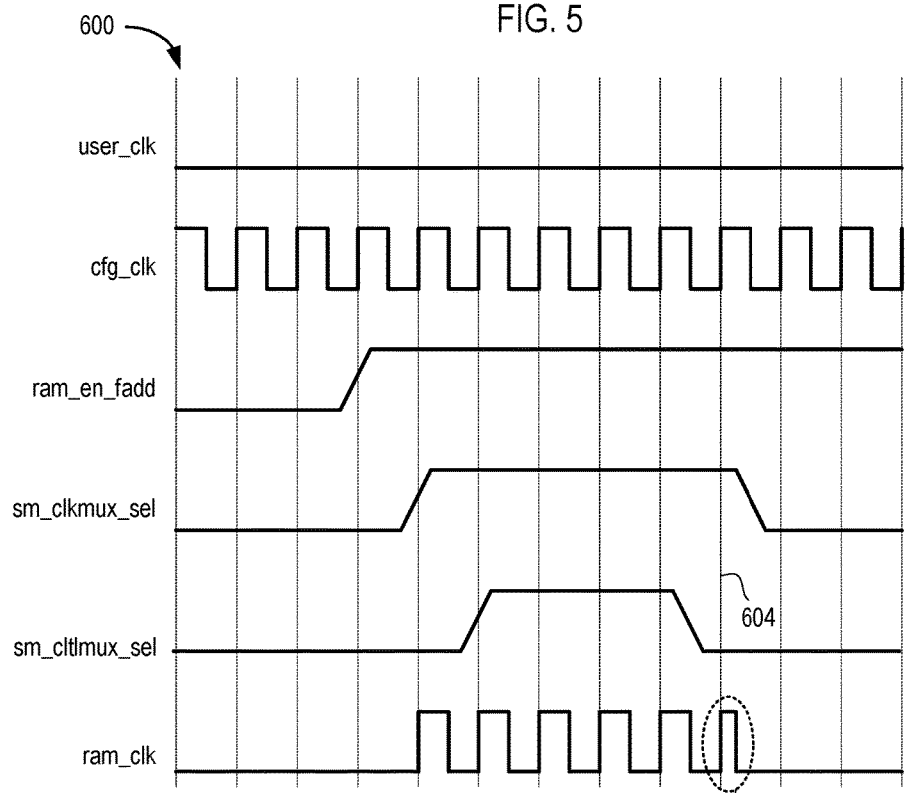
FIG. 6 is a signal diagram depicting signals of the memory circuit of FIG. 4 in more detail according to the example of FIG. 5.

FIG. 6 is a signal diagram 600 depicting signals of the BRAM 103 in more detail according to the example of FIG. 5. The signal diagram 600 shows states of the user_clk, cfg_clk, ram_en_fadd, sm_clkmux_sel, sm_ctrlmux_sel, and ram_clk signals during the beginning of a readback capture operation. As described above, the user_clk signal is suspended (not toggling). The cfg_clk signal is active and toggling. Assertion of the ram_en_fadd signal begins readback capture for a particular frame. After assertion of the ram_en_fadd signal, the SM 450 asserts the sm_clkmux_sel signal to switch clock domains from the user clock to the configuration clock. The ram_clk signal begins to toggle based on the state of the signal cfg_clk. The SM 450 then asserts the signal sm_ctrlmux_sel to supply the SM-generated control signal (sm_control) to the configurable RAM 402. Some time later, the SM 450 de-asserts the sm_ctrlmux_sel signal and then de-asserts the sm_clkmux_sel signal.

In the sequence described above, the configuration clock is applied to the configurable RAM 402 before the SM-generated control signal. There is at least one clock cycle during the switching of the clock domains when the user-generated control signal is supplied to the configurable RAM 402, rather than the SM-generated control signal. In particular, the user-generated enable and address signals are coupled to the configurable RAM 402 during the clock domain switch. Since the user clock and the configuration clock have an unknown relationship, a situation may arise where a glitch on the signal ram_clk driving the configurable RAM 402 occurs during the clock domain transfer even if the user clock is stopped. In the example of FIG. 6, such a glitch 602 occurs when de-assertion of the signal sm_clkmux_sel_causes a shortened clock pulse. In such a situation, an undesired read or write can occur depending on the state of the user enable signals. For example, if a user-generated write-enable (WE) is asserted, then a write may result that corrupts the memory contents. The SM 450 switches clock domains for each frame, which increases the probability of corruption (the more frames the more likely a glitch will cause corruption). One way to handle this situation is to shutdown the FPGA 100, which will de-assert a global write enable (GWE) signal and disables writing to BRAMs and flops in the FPGA 100. However, emulation of a circuit using the FPGA 100 is performed in user-mode where the GWE signal asserted. Another way to handle this situation is for the user to perform a pre-requisite step of ensuring the user-generated enables are de-asserted. This puts the onus on the user to remember de-assert user-generated enables to the BRAM 3.

Figure 7:
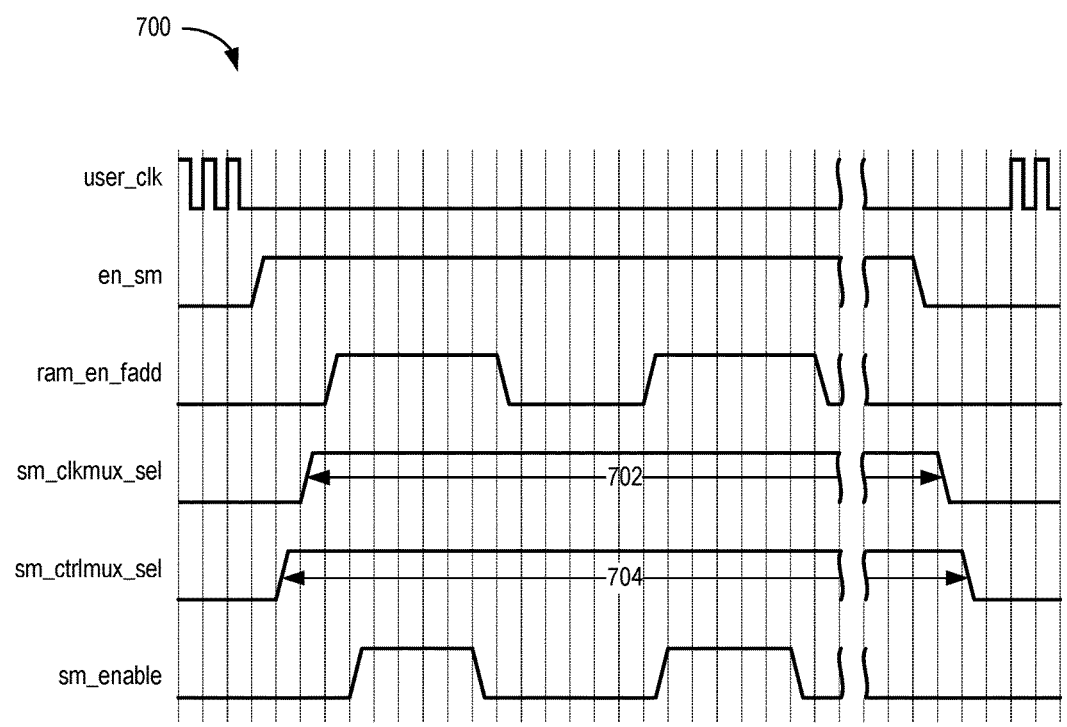
FIG. 7 is a signal diagram depicting signals of the memory circuit of FIG. 4 according to another example that prevents corruption thereof during readback capture.

FIG. 7 is a signal diagram 700 depicting signals of the BRAM 3 according to another example that prevents corruption of the BRAM 3. The signal diagram 700 shows the signals user_clk, en_sm, ram_en_fadd, sm_clkmux_sel, sm_ctrlmux_sel, as well as a signal sm_enable. The signal sm_enable is not explicitly shown as a separate signal in FIG. 4, but is a component of the signal sm_control. The signal sm_enable can be a general enable or read enable for the configurable RAM 402.

The signals user_clk, en_sm, and ram_en_fadd are configured as described above. However, the signals sm_clkmux_sel and sm_ctrlmux_sel are modified to prevent corruption of the BRAM 3. In particular, the signal sm_ctrlmux_sel is asserted prior to the signal sm_clkmux_sel in response to assertion of the en_sm signal (rather than in response to assertion of the ram_en_fadd signal). Likewise, the signal sm_clkmux_sel is de-asserted prior to de-assertion of the signal sm_ctrlmux_sel. The signal sm_clkmux_sel is de-asserted in response to de-assertion of the en_sm signal, and the sm_ctrlmux_sel signal is de-asserted in response to de-assertion of the sm_clkmux_sel signal.

In this manner, both clock domain switches occur after the SM 450 switches to the SM-generated control signal. The sm_enable signal is asserted one or more clock cycles after assertion of the sm_clkmux_sel signal. Thus, any clock glitches that occur due to the clock domain switch will occur when the sm_enable signal is de-asserted, which prevents any unintentional read/write operations. In addition, the handoffs between user and SM, and between SM and user, occur only once during the readback capture operation, rather than for each frame. That is, a period 702 and a period 704 of assertion of the signals sm_clkmux_sel and sm_ctrlmux_sel are commensurate with the pulse width of the en_sm signal. This avoids unnecessary switching back and forth between domains for a more robust design.

Figure 8:
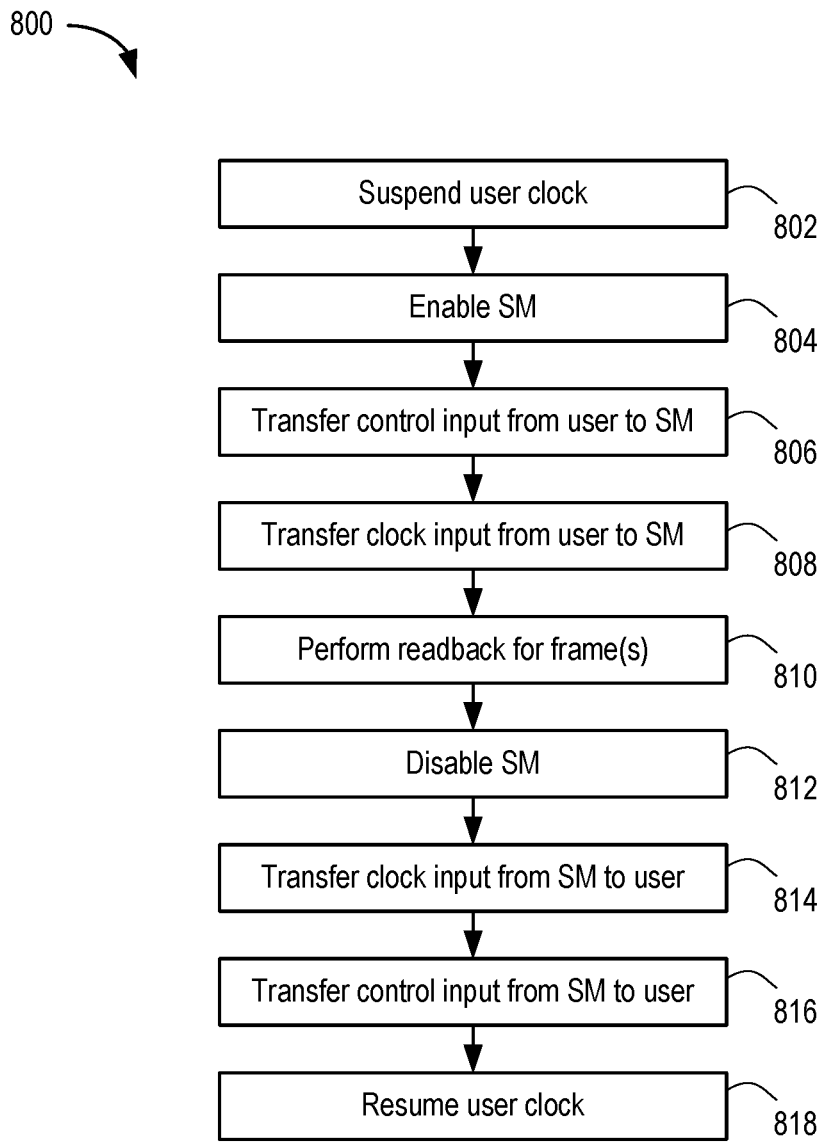
FIG. 8 is a flow diagram depicting a method of performing readback capture of a memory circuit according to an example.

FIG. 8 is a flow diagram depicting a method 800 of performing readback capture of a BRAM 3 according to an example. The method 800 begins at step 802, where the user circuit 304 suspends the user clock (user_clk). At step 804, the user issues a readback command to the configuration logic 204, which in turn enables the SM 450 in the BRAM 3 (through assertion of en_sm). At step 806, the SM 450 transfers control of the configurable RAM 402 from the user domain to the SM domain. That is, the SM 450 controls the multiplexer 428 to select the sm_control signal generated by the SM 450. At step 808, the SM 450 transfers the clock applied to the configurable RAM 402 from the user domain to the SM domain. That is, the SM 450 controls the multiplexer 430 to select the cfg_clk signal. At step 810, the SM 450 performs readback for one or more frames (e.g., in response to repeated assertion and de-assertion of the ram_en_fadd signal). The readback operation includes sequences of enabling and disabling the configurable RAM 402 for reading.

At step 812, the configuration logic 204 disables the SM 450 (through de-assertion of en_sm). At step 814, the SM 450 transfers the clock applied to the configurable RAM 402 from the SM domain to the user domain. That is, the SM 450 controls the multiplexer 430 to select the user_clk signal. At step 816, the SM 450 transfers control of the configurable RAM 402 from the SM domain to the user domain. That is, the SM 450 controls the multiplexer 428 to select the user_control signal generated by the user circuit 304. At step 818, the user circuit 304 resumes the user clock (user_clk).

Preventing Loss of Previous State During Readback Capture

As shown in FIG. 4, the latched output 432 of the configurable RAM 402 propagates through some output multiplexer logic and optionally a register (REG 416). Since there is only one path between the latched output 432 and the data-out port 442, the same output path is used for both normal operation and readback capture. Thus, at the end of a readback operation, the latched data of the output latches 406 is overwritten with data from the last frame of readback. The latched data generated by the last user operation is lost. If the user intends to resume the design after the readback operation, the user must redo the last operation that occurred before the readback capture operation. This is cumbersome for the user and may cause defective behavior if the user mistakenly forgets to re-issue the last operation before readback capture. According to an example, the BRAM 3 shown in FIG. 4 is modified to avoid loss of previous state during readback capture, as discussed further below.

Figure 9A:
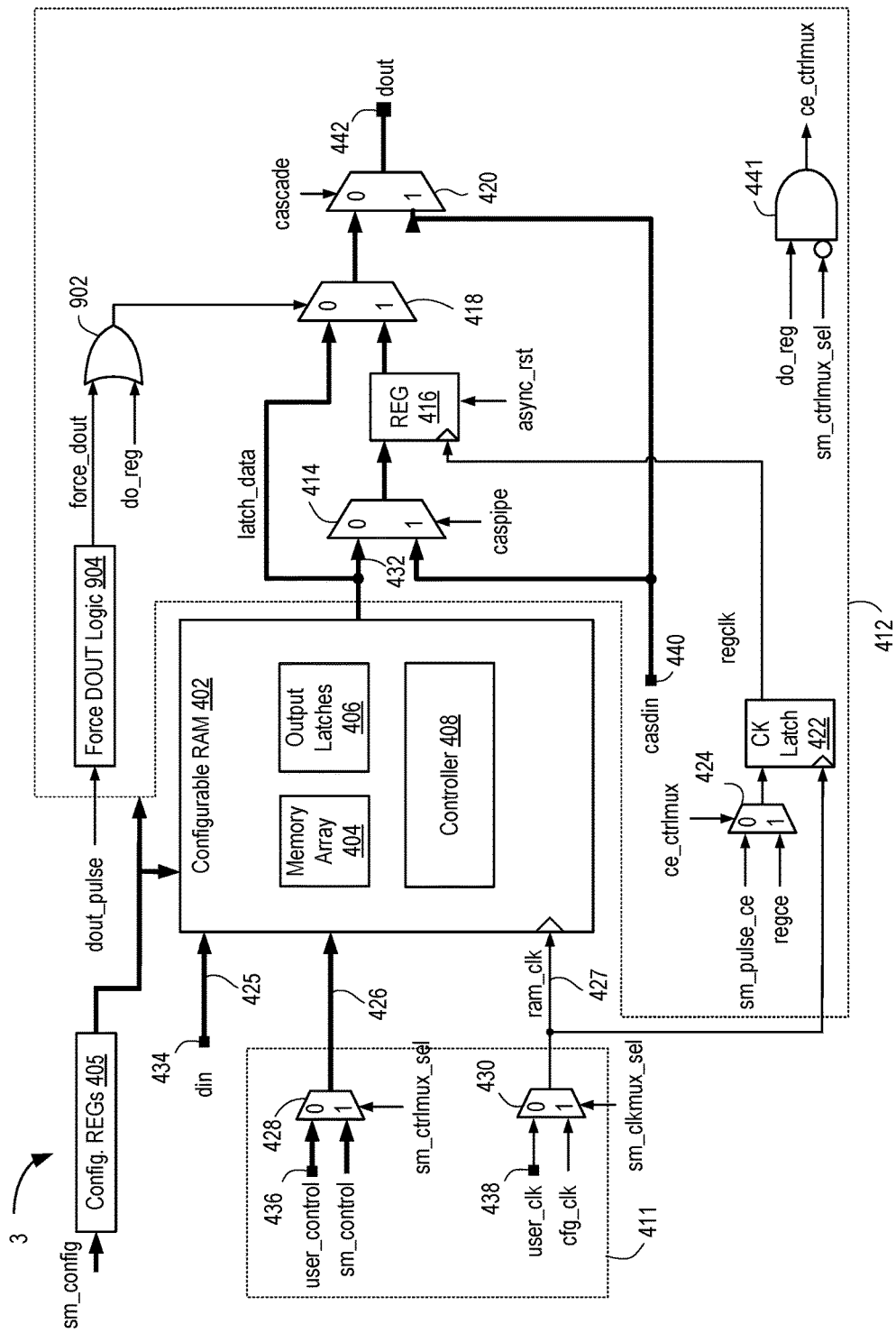
FIGS. 9A and 9B are block diagrams showing a memory circuit of a programmable IC according to another example.
Figure 9B:
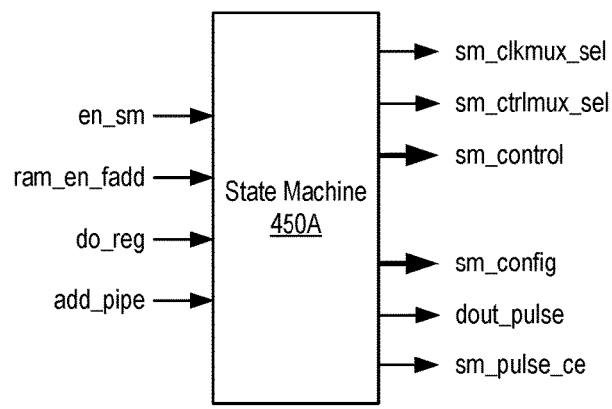

FIGS. 9A and 9B are block diagrams showing a BRAM 3 according to another example. FIG. 9A illustrates the configurable RAM 402, the output logic 412, and a portion of the readback capture logic 210. FIG. 9B illustrates an SM 450A that is part of the readback capture logic 210. Elements in FIGS. 9A and 9B that are the same or similar to those of FIG. 4 are designated with the same or similar reference numerals.

As shown in FIG. 9A, the BRAM 3 of FIG. 4 is modified as follows. First, the multiplexer 424 receives a signal sm_pulse_ce at the first input (the "0" input) and the signal regce at the second input (the "1" input). A control input of the multiplexer 424 receives a signal ce_ctrlmux. The output logic 412 further includes an AND gate 441 having an output that supplies the signal ce_ctrlmux. Inputs of the AND gate 441 receive the signal do_reg and a logical complement of the signal sm_ctrlmux_sel. Thus, the multiplexer 424 is controlled by do_reg & !sm_ctrlmux_sel, where "&" symbolizes logical AND and "!" symbolizes logical inversion. When the output of the AND gate 441 is asserted, the multiplexer 424 selects the signal regce. When the output of the AND gate 441 is de-asserted, the multiplexer 424 selects the signal sm_pulse_ce. The signal sm_pulse_ce is generated by the SM 450A, as discussed further below.

The output logic 412 further includes force DOUT logic 904 and an OR gate 902. An input of the force DOUT logic 904 receives a signal dout_pulse, which is generated by the SM 450A as described below. An output of the force DOUT logic 904 is coupled to an input of the OR gate 902. The signal do_reg is coupled to a second input of the OR gate 902. The output of the force DOUT logic 904 supplies a signal force_dout. An output of the OR gate 902 is coupled the control input of the multiplexer 418.

As shown in FIG. 9B, the SM 450A receives the signals en_sm and ram_en_fadd, and generates the signals sm_clkmux_sel, sm_ctrlmux_sel, sm_control, and sm_config, as described above with the SM 450. In addition, the SM 450A receives the signal do_reg and a signal add_pipe. The signal add_pipe is a configurable attribute of the BRAM 3 and can be supplied by a configuration register 405. If asserted, the signal add_pipe adds additional register(s) in the output pipeline of the BRAM 3 (not explicitly shown). The SM 450A also generates the signal dout_pulse and the signal sm_pulse_ce.

In general, the SM 450A performs a readback capture operation by configuring the configurable RAM 402 to omit the REG 416 from the output pipeline. Before performing any read operations, the SM 450A clocks the latch_data signal into the REG 416, thereby saving the previous state of the output latches 406. The SM 450A performs the read operations for one or more frames. After readback is complete, the SM 450A signals the force DOUT logic 904 to force the REG 416 into the output pipeline until the user performs a subsequent operation that changes the state of the latched output.

Saving the previous latched state into the unused REG 416 only saves one pipeline of data. If the user has already enabled REG 416 in the user design, then the latched data will still be lost during the readback operation. Further, if the user has enabled a pipeline register in the ECC logic 410, then the content in this register will also be lost during the readback operation. Thus, in an example, the SM 450A only performs the operation of preserving the latched data in the REG 416 if the user has configured the BRAM 3 in latch mode (i.e., the REG 416 is unused in the user design) without any additional pipeline registers enabled (e.g., the user has not enabled a register in the ECC logic 410). To ensure this, the SM 450A can check that both the do_reg and add_pipe signals are de-asserted when a readback operation is initiated. If so, the SM 450A performs the operation of preserving the latched data in the REG 416, as described further below.

Figure 11:
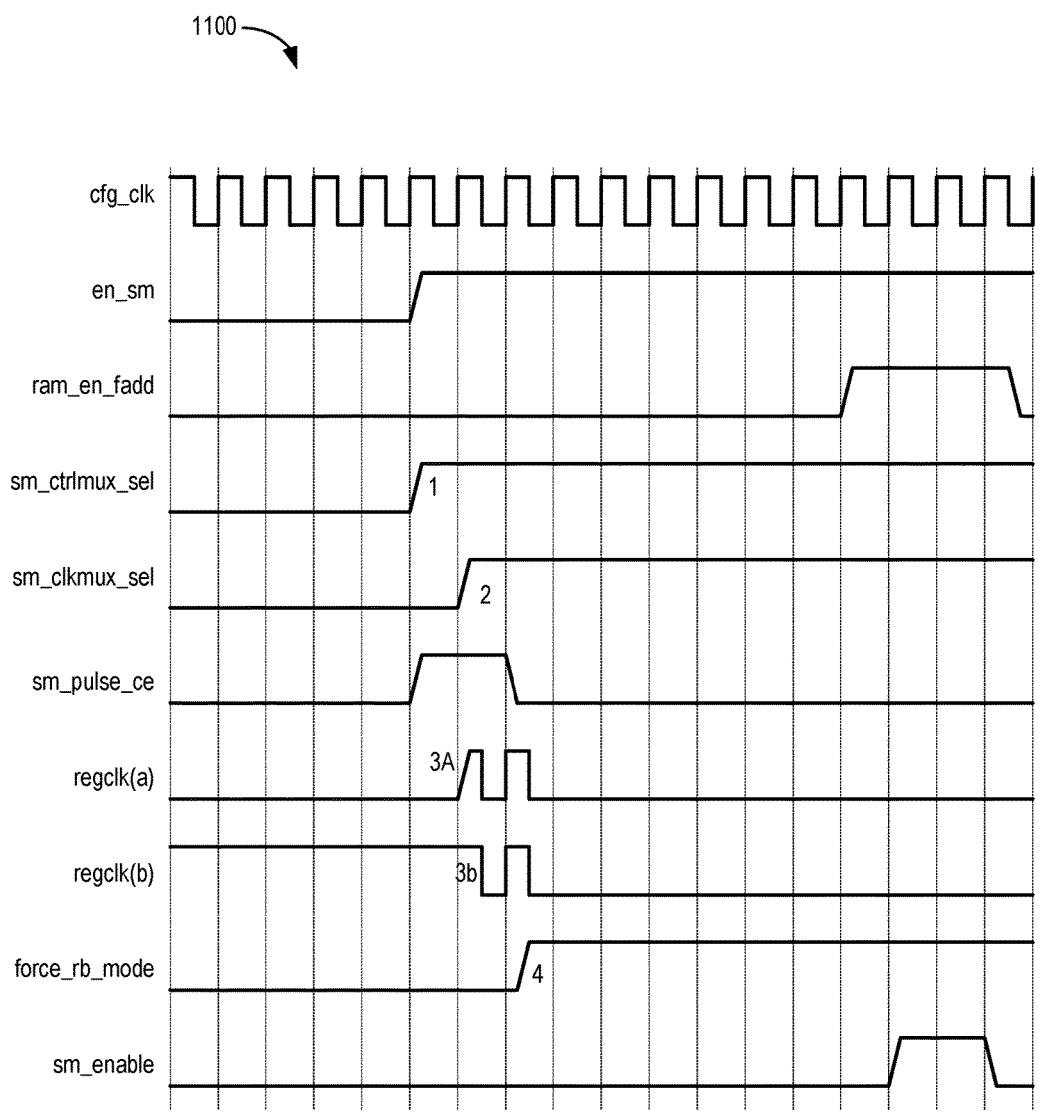
FIG. 11 is a signal diagram depicting signals of the memory circuit of FIGS. 9A-B according to an example.

FIG. 11 is a signal diagram 1100 depicting signals of the BRAM 3 according to an example. The signal diagram 1100 includes states of the signals cfg_clk, en_sm, ram_en_fadd, sm_ctrlmux_sel, sm_clkmux_sel, sm_pulse_ce, and sm_enable. The signal diagram 1100 also shows two alternative versions of a signal regclk output by the CK latch 422 (regclk (a) and regclk (b)). The signal diagram 1100 also shows a signal force_rb_mode. The signal force_rb_mode is not explicitly shown in FIGS. 9A and 9B, but can be a signal in the sm_config signal generated by the SM 450A. When the signal force_rb_mode is asserted, the BRAM 3 is configured in latch mode, configured to have its maximum supported width, and is configured to turn off features that are not needed (e.g., ECC encode/decode). In addition, assertion of the force_rb_mode signal turns off cascade mode to ensure all data driven to dout originates from the BRAM 3 (and not some other BRAM).

The signals cfg_clk, en_sm, ram_en_fadd, sm_ctrlmux_sel, sm_clkmux_sel, and sm_enable are configured as described above. Notably, the signal sm_ctrlmux_sel is asserted before the signal sm_clkmux_sel as described above to avoid corruption of the BRAM 3 due to glitches in the ram_clk signal. This sequence is indicated by numbers 1 and 2 in the signal diagram 1100. Further, the SM 450A does not assert the sm_enable signal, which enables the BRAM 3 for reading, until the configuration logic 204 asserts the signal ram_en_fadd (at the start of a frame). Thus, during the time between assertion of the signal sm_ctrlmux_sel and the signal sm_enable, the BRAM 3 is not enabled to perform a read or write operation.

The SM 450A asserts the signal sm_pulse_ce prior to performing readback operations (e.g., at or around the time of the control input transfer from the user domain to the SM domain). In the example of FIG. 11, the SM 450A asserts the sm_pulse_ce signal concurrently with the sm_ctrlmux_sel signal. The SM 450A de-asserts the sm_pulse_ce signal after one or more clock cycles. The pulse in the sm_pulse_ce signal is fed into the CK latch 422, which results in at least one pulse in the signal regclk. In particular, if the user_clk signal was stopped in the logic low state, then the regclk signal will include one pulse (as shown by regclk (b)). If the user_clk was stopped in the logic high state, then the regclk signal will include two pulses (as shown by regclk (a)). The double pulse in the regclk signal does not pose a problem, since the same stable latched data will be clocked into the REG 416 twice. This is shown by numbers 3A and 3B in the signal diagram 1100.

Prior to saving the latched data in the REG 416, the SM 450A does not change the configuration of the BRAM 3, since any configuration change may result in a change of the latched data. Thus, the SM 450A does not assert the force_rb_mode signal until after the latched data has been preserved in the REG 416 (e.g., after pulsing the regclk signal). This is shown by number 4 in the signal diagram 1100.

Figure 12:
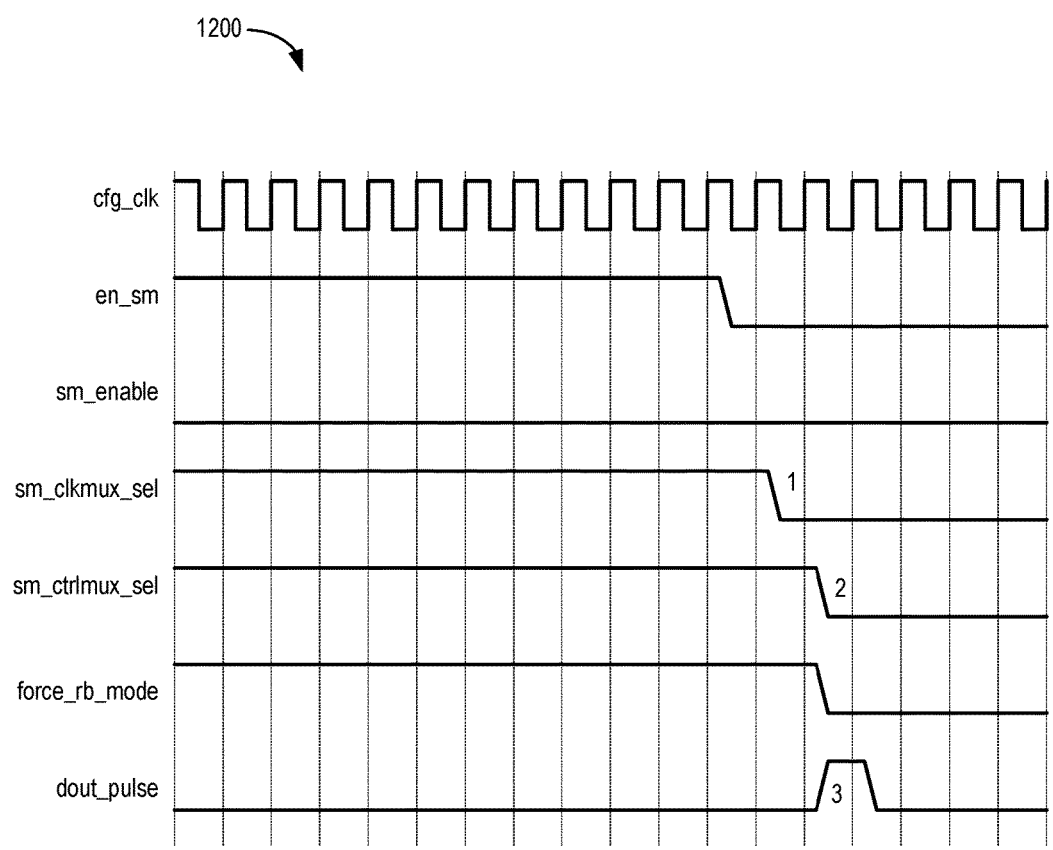
FIG. 12 is a signal diagram depicting signals of the memory circuit of FIGS. 9A-B according to an example.

FIG. 12 is a signal diagram 1200 depicting signals of the BRAM 3 according to an example. The signal diagram 1200 includes states of the signals cfg_clk, en_sm, sm_enable, sm_ctrlmux_sel, sm_clkmux_sel, force_rb_mode, and dout_pulse at the time a readback operation is completed. First, the configuration logic 204 de-asserts the signal en_sm to disable the SM 450A. The signal sm_enable remains de-asserted, since there is no readback operations being performed. Next, the SM 450A de-asserts the sm_clkmux_sel signal (noted by number 1) and then de-asserts the sm_ctrlmux_sel signal (noted by number 2). That is, the SM 450A first transfers the clock input to the user domain, followed by transferring the control input to the user domain, as described above. The SM 450A de-asserts the signal force_rb_mode concurrently with de-assertion of the sm_ctrlmux_sel signal. Finally, the SM 450A asserts the dout_pulse signal concurrently with de-assertion of the force_rb_mode and sm_ctrlmux_sel signals, and then de-asserts the dout_pulse signal one or more clock cycles later. This is shown by number 3 in the signal diagram 1200. The pulse in the dout_pulse signal causes the force DOUT logic 904 to force the multiplexer 418 to select output of the REG 416 regardless of the value of the signal do_reg (which is assumed de-asserted in the user design in this mode of preserving the last latched state of the BRAM 3). Thus, the last latched state of the BRAM 3 will appear at dout after the readback operation. The force DOUT logic 904 operates as described below.

The SM 450A captures the correct latched data in all cases of the last user operation. The last user operation before readback capture can take the form of a valid read, a no-op since start-up (a global asynchronous reset would have been the last operation), a synchronous user reset, or an asynchronous user reset. In addition to these operations, the user may have configured cascading of multiple BRAMs such, in the last user operation, dout is coming from the cascaded input going through the multiplexer 420. In a typical case of the last operation being a read operation, the last latched user data will be clocked into the REG 416. In the case of an asynchronous reset, the REG 416 will be reset automatically (through assertion of the signal async_rst). In the case the last user operation is a synchronous reset, the reset value is clocked into the REG 416. Thus, no special care is needed to handle resets. In the case where the cascade is enabled (e.g., the cascade signal is asserted), the REG 416 is bypassed and the signal casdin goes through the multiplexer 420 to dout. Thus, casdin signal itself cannot be clocked into the REG 416 to preserve its state. However, since all of the multiplexer circuitry is combinatorial logic, dout will return to the original user state (cascade asserted) upon completion of the readback capture operation as long as the first BRAM 3 has its state preserved.

Figure 10:
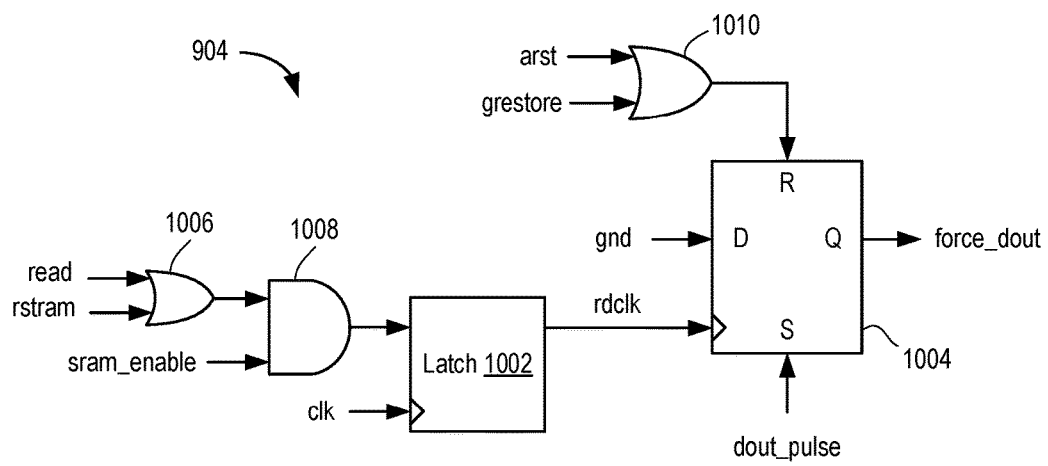
FIG. 10 is a block diagram depicting control logic in a memory circuit according to an example.

FIG. 10 is a block diagram depicting the force DOUT logic 904 according to an example. The force DOUT logic 904 includes a latch 1002, a flip-flop 1004, an OR gate 1006, an AND gate 1008, and an OR gate 1010. A first input of the OR gate 1006 receives a signal read and a second input of the OR gate 1006 receives a signal rstram. An output of the OR gate 1006 is coupled to a first input of the AND gate 1008. A second input of the AND gate 1008 receives a signal sram_enable. An output of the AND gate 1008 is coupled to an input of the latch 1002. A clock input of the latch 1002 receives the signal ram_clk. An output of the latch 1002 provides a signal rdclk to a clock input of the flip-flop 1004. A data input (D) of the flip-flop 1004 receives a ground signal (e.g., logic "0"). A set input (S) of the flip-flop 1004 receives the signal dout_pulse from the SM 450A. A reset input (R) of the flip-flop 1004 is coupled to an output of the OR gate 1010. A data output (Q) of the flip-flop 1004 supplies the signal force_dout. Inputs of the OR gate 1010 receive the signals arst and grestore, respectively.

In operation, the SM 450A sets the flip-flop 1004 with a pulse on the signal dout_pulse after completion of a readback operation, as discussed above. This causes the signal force_dout to be asserted so that the REG 416 is coupled to the data-out port 442. The force DOUT logic 904 de-asserts the signal force_dout in response to various events. For example, assertion of the signal rstram indicates a synchronous user reset of the BRAM 3. Assertion of the signal read indicates a read operation issued to the BRAM 3. In both cases, the user has updated the latched data state and thus the output pipeline is no longer forced to output the previous state stored in the REG 416. If the BRAM 3 is enabled, either of the signals rstram or read are asserted, and ram_clk is toggling, the latch 1002 asserts the signal rdclk, which causes the flip-flop 1004 to clock in logic "0" and de-assert the signal force_dout. If at any time either the user generates an asynchronous reset or a global asynchronous reset is asserted, the flip-flop 1004 is cleared and force_dout is de-asserted. In case of asynchronous reset, the user has updated the latched data state and thus the output pipeline is no longer forced to output the previous state stored in the REG 416. Note that if the signal ram_clk is not toggling (i.e., the user clock has not resumed), or if there is no operation issued to the BRAM 3, or if only a write operation is issued to the BRAM 3 (i.e., both signals read and rstram are de-asserted), then the signal force_dout remains asserted. In such cases, the user has not updated the latched data state of the BRAM 3 and thus the output pipeline remains forced to output the previous state stored in the REG 416.

Figure 13:
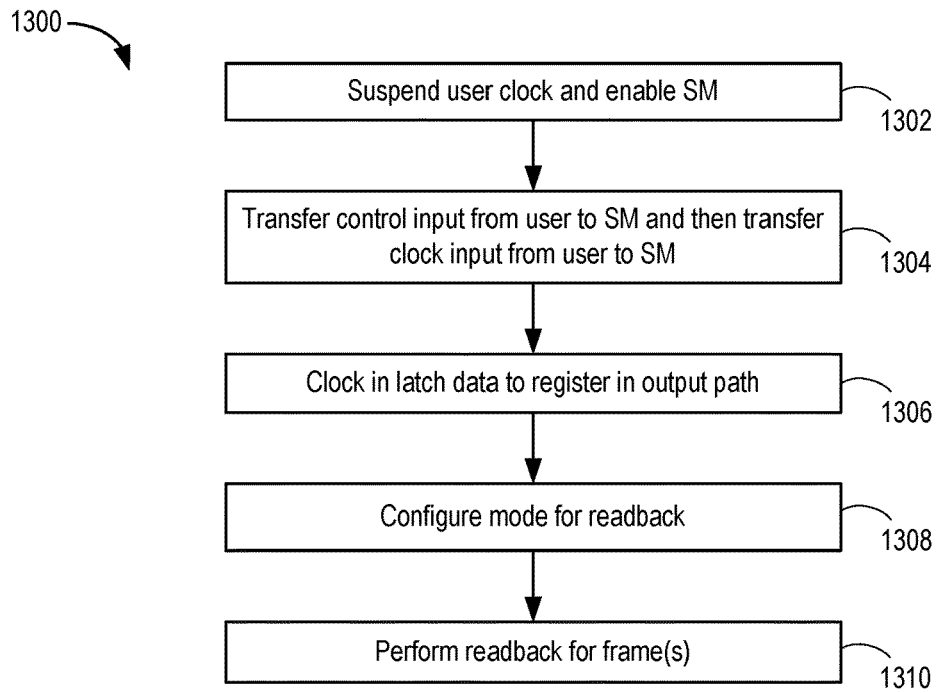
FIG. 13 is a flow diagram depicting a method of initiating a readback operation according to an example.

FIG. 13 is a flow diagram depicting a method 1300 of initiating a readback operation according to an example. The method 1300 begins at step 1302, where the user circuit 304 suspends the user clock and the configuration logic 204 enables the SM 450A. At step 1304, the SM 450A transfers control of the BRAM 3 from the user to the SM and then transfers the clock input from the user clock domain to the SM clock domain. At step 1306, the SM 450A causes the REG 416 to clock in the current state of the latched output of the configurable RAM 402. At step 1308, the SM 450A configures the mode of the BRAM 3 for readback. That is, the SM 450A changes configuration of the BRAM 3, such setting the port width to maximum. At step 1310, the SM 450A controls the configurable RAM 402 to readback one or more frames.

Figure 14:
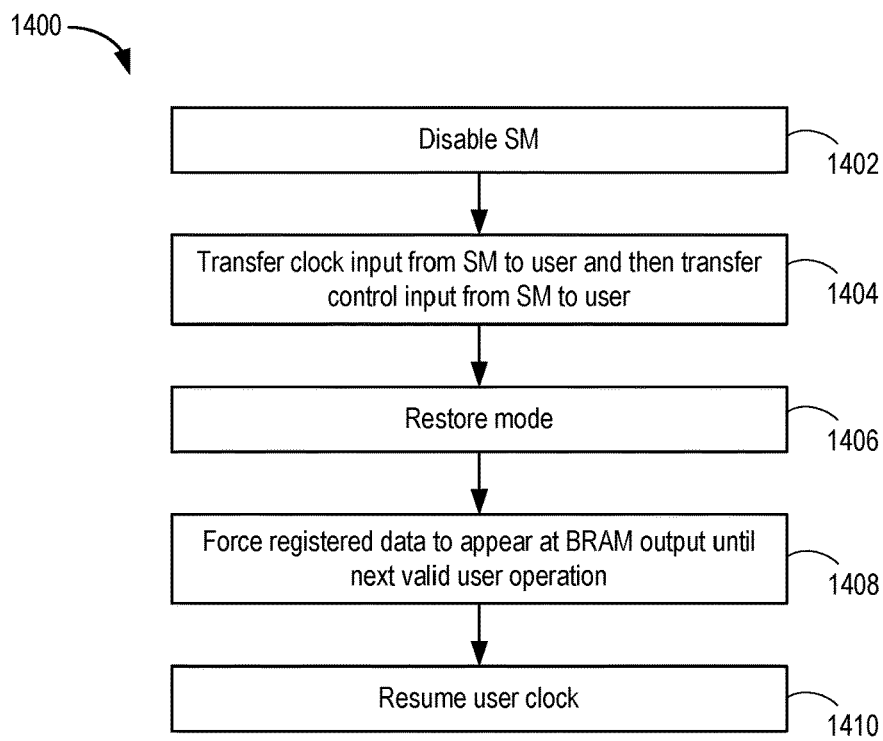
FIG. 14 is a flow diagram depicting a method of terminating a readback operation according to an example.

FIG. 14 is a flow diagram depicting a method 1400 of terminating a readback operation according to an example. The method 1400 begins at step 1402, where the configuration logic 204 disables the SM 450A. At step 1404, the SM 450A transfers the clock input of the configurable RAM 402 from the SM domain to the user domain and then transfers control of the BRAM 3 from the SM to the user. At step 1406, the SM 450A restores the mode of the BRAM 3 to the user-selected mode. At step 1408, the SM 450A forces the registered data in the REG 416 to appear at the BRAM output (i.e., at the data-out port 442) until a next valid user operation that changes the latched state of the BRAM 3. At step 1410, the user circuit 304 resumes the user clock.

While the foregoing is directed to specific examples, other and further examples may be devised without departing from the basic scope thereof, and the scope thereof is determined by the claims that follow.

What is claimed is:

1. A memory circuit in a programmable integrated circuit (IC), the memory circuit comprising:
   a control port and a clock port;
   a configurable random access memory (RAM) having a control input and a clock input;
   input multiplexer logic coupled to the control input and the clock input; and
   a state machine coupled to the input multiplexer logic and configuration logic of the programmable IC, the state machine configured to:
      in response to being enabled by the configuration logic, control the input multiplexer logic to switch a connection of the control input from the control port to the state machine and, subsequently, switch a connection of the clock input from the clock port to a configuration clock source; and
      in response to being disabled by the configuration logic, control the input multiplexer logic to switch the connection of the clock input from the configuration clock source to the clock port and, subsequently, switch the connection of the control input from the state machine to the control port.

2. The memory circuit of claim 1, wherein the state machine is configured to perform a readback operation that includes sequences of enabling and then disabling the configurable RAM for reading between a first time of switching the connection of the clock input from the clock port to the configuration clock source and a second time of switching the connection of the clock input from the configuration clock source to the clock port.

3. The memory circuit of claim 1, further comprising:
a data output port;
output logic coupled between a latched output of the configurable RAM and the data output port, the output logic including output multiplexer logic and a register;
wherein the state machine is configured to store a state of the latched output in the register prior to performing a readback operation.

4. The memory circuit of claim 3, wherein the state machine is further configured to:
switch a configuration of the configurable RAM from a first configuration to a second configuration after storing the state of the latched output in the register; and
in response to being disabled by the configuration logic, switch the configuration of the configurable RAM from the second configuration to the first configuration.

5. The memory circuit of claim 3, further comprising:
control logic coupled to the output multiplexer logic;
wherein the state machine is configured to, in response to being disabled by the configuration logic, cause the control logic to control the output multiplexer logic to switch a connection of the data output port from the latched output to the register.

6. The memory circuit of claim 5, wherein the control logic is configured to control the output multiplexer logic to switch the connection of the data output port from the register to the latched output in response to at least one of a read operation, a synchronous reset operation, or an asynchronous reset operation.

7. The memory circuit of claim 5, wherein the readback operation includes sequences of enabling and then disabling the configurable RAM for reading between a first time of storing the state of the latched output in the register and a second time of causing the control logic to control the output multiplexer logic to switch the connection of the data output port from the latched output to the register.

8. A programmable integrated circuit (IC), comprising:
configuration logic that controls a configuration memory;
first and second clock sources; and
a programmable fabric having a memory circuit, the memory circuit comprising:
a configurable random access memory (RAM) having a control input and a clock input;
input multiplexer logic coupled to the control input and the clock input; and
a state machine coupled to the input multiplexer logic and the configuration logic, the state machine configured to:
in response to being enabled by the configuration logic, control the input multiplexer logic to switch a connection of the control input from the programmable fabric to the state machine and, subsequently, switch a connection of the clock input from the first clock source to the second clock source; and
in response to being disabled by the configuration logic, control the input multiplexer logic to switch the connection of the clock input from the second clock source to the first clock source and, subsequently, switch the connection of the control input from the state machine to the programmable fabric.

9. The programmable IC of claim 8, wherein the state machine is configured to perform a readback operation that includes sequences of enabling and then disabling the configurable RAM for reading between a first time of switching the connection of the clock input from the first clock source to the second clock source and a second time of switching the connection of the clock input from the second clock source to the first clock source.

10. The programmable IC of claim 8, wherein the memory circuit further comprises:
a data output port coupled to the programmable fabric;
output logic coupled between a latched output of the configurable RAM and the data output port, the output logic including output multiplexer logic and a register;
wherein the state machine is configured to store a state of the latched output in the register prior to performing a readback operation.

11. The programmable IC of claim 10, wherein the state machine is further configured to:
switch a configuration of the configurable RAM from a first configuration to a second configuration after storing the state of the latched output in the register; and
in response to being disabled by the configuration logic, switch the configuration of the configurable RAM from the second configuration to the first configuration.

12. The programmable IC of claim 10, wherein the memory circuit further comprises:
control logic coupled to the output multiplexer logic;
wherein the state machine is configured to, in response to being disabled by the configuration logic, cause the control logic to control the output multiplexer logic to switch a connection of the data output port from the latched output to the register.

13. The programmable IC of claim 12, wherein the control logic is configured to control the output multiplexer logic to switch the connection of the data output port from the register to the latched output in response to at least one of a read operation, a synchronous reset operation, or an asynchronous reset operation.

14. The programmable IC of claim 12, wherein the readback operation includes sequences of enabling and then disabling the configurable RAM for reading between a first time of storing the state of the latched output in the register and a second time of causing the control logic to control the output multiplexer logic to switch the connection of the data output port from the latched output to the register.

15. A method of readback capture of a memory circuit in a programmable integrated circuit (IC), the method comprising:
suspending a user clock coupled to the memory circuit;
enabling a state machine coupled between configuration logic of the programmable IC and the memory circuit;
transferring connection of a control input of the memory circuit from a user circuit configured in the programmable IC to the state machine;
transferring connection of a clock input of the memory circuit from the user clock to a configuration clock of the configuration logic; and
performing a readback operation that includes sequences of enabling and disabling the memory circuit for reading.

16. The method of claim 15, further comprising:
disabling the state machine;
transferring the connection of the clock input of the memory circuit from the state machine to the user circuit;
transferring the connection of the control input of the memory circuit from the configuration clock to the user clock; and
resuming the user clock.

17. The method of claim 15, wherein the memory circuit includes output logic coupled between a latched output and the user circuit, the output logic including multiplexer logic and a register, and wherein the method further comprises:
  storing a state of the latched output in the register prior to the step of performing the readback operation.

18. The method of claim 17, further comprising:
  switching a configuration of the memory circuit from a first configuration to a second configuration after the step of storing the state of the latched output and before performing the readback operation.

19. The method of claim 17, further comprising:
  disabling the state machine;
  transferring the connection of the clock input of the memory circuit from the state machine to the user circuit;
  transferring the connection of the control input of the memory circuit from the configuration clock to the user clock; and
  controlling the multiplexer logic in the output logic connect output of the register to the user circuit.

20. The method of claim 19, further comprising:
  controlling the multiplexer logic in the output logic to connect the latched output to the user circuit in response to at least one of a read operation, a synchronous reset operation, or an asynchronous reset operation.

* * * * *